(12) United States Patent
Endo et al.

(10) Patent No.: US 7,713,838 B2
(45) Date of Patent: May 11, 2010

(54) SOI WAFER AND ITS MANUFACTURING METHOD

(75) Inventors: Akihiko Endo, Tokyo (JP); Nobuyuki Morimoto, Tokyo (JP)

(73) Assignee: Sumco Corporation, Tokyo (JP)

( * ) Notice: Subject to any disclaimer, the term of this patent is extended or adjusted under 35 U.S.C. 154(b) by 317 days.

(21) Appl. No.: 10/570,669

(22) PCT Filed: Sep. 8, 2004

(86) PCT No.: PCT/JP2004/013068

§ 371 (c)(1),
(2), (4) Date: Mar. 6, 2006

(87) PCT Pub. No.: WO2005/027217

PCT Pub. Date: Mar. 24, 2005

(65) Prior Publication Data

US 2007/0032043 A1    Feb. 8, 2007

(30) Foreign Application Priority Data

Sep. 8, 2003    (JP)    ............................... 2003-315987

(51) Int. Cl.
*H01L 21/30* (2006.01)
(52) U.S. Cl. ............................... 438/458; 257/E21.568; 438/455
(58) Field of Classification Search ............... 438/455, 438/458; 257/E21.568
See application file for complete search history.

(56) References Cited

U.S. PATENT DOCUMENTS 5,753,353 A    5/1998    Kikuchi 6,008,110 A    12/1999    Samata et al.
6,613,678 B1 *    9/2003    Sakaguchi et al. .......... 438/695
6,884,696 B2 *    4/2005    Aga et al. ................... 438/459

FOREIGN PATENT DOCUMENTS

| JP | 2-267195 | 10/1990 |
| JP | 5-226620 | 9/1993 |
| JP | 8-037286 | 2/1996 |
| JP | 8-139295 | 5/1996 |
| JP | 9-326396 | 12/1997 |
| JP | 11-307470 | 11/1999 |

OTHER PUBLICATIONS

English Language Abstract of JP 9-326396.
English Language Abstract of JP 2-267195.
English Language Abstract of JP 11-307470.
English language Abstract of JP 5-226620.

(Continued)

*Primary Examiner*—Asok K Sarkar
(74) *Attorney, Agent, or Firm*—Greenblum & Bernstein, P.L.C.

(57) ABSTRACT

Since a supporting wafer contains boron of $9 \times 10^{18}$ atoms/cm$^3$ or more, therefore a part of the metal impurities in an active layer wafer and the metal impurities in the wafer can be captured by the boron during the heat treatment for bonding. As a result, metal contamination in the active layer can be reduced. Moreover, the wafer strength is enhanced, thus preventing the wafer slipping. Since the wafer has no COP, micro voids are not detected in the LPD evaluation of the active layer, thereby improving the reliability of the evaluation. Such a bonded wafer can be manufactured at a low cast.

1 Claim, 3 Drawing Sheets

OTHER PUBLICATIONS

U.S. Appl. No. 10/570,665 to Endo et al., filed Mar. 6, 2006.
U.S. Appl. No. 10/570,663 to Endo et al., filed Mar. 6, 2006.
U.S. Appl. No. 10/569,942 to Endo et al., filed Feb. 28, 2006.
U.S. Appl. No. 10/570,668 to Endo et al., filed Mar. 6, 2006.
U.S. Appl. No. 10/570,353 to Morimoto et al., filed Mar. 3, 2006.
U.S. Appl. No. 10/570,354 to Morimoto et al., filed Mar. 3, 2006.

* cited by examiner

SOI WAFER AND ITS MANUFACTURING METHOD

FIELD OF THE INVENTION

The present invention relates to an SOI wafer and a manufacturing method of the same, and more specifically to a technology for manufacturing an SOI wafer inexpensively by taking advantage of a bonding method capable of: decreasing a level of contamination resultant from metal impurities contained in an active layer; providing a sufficient strength to suppress an occurrence of slip of a supporting wafer; and improving precision in the LPD evaluation of the active layer of thin film.

DESCRIPTION OF THE PRIOR ART

Recently, film thickness reduction of an active layer (less than 0.10 μm has been progressed in conjunction with a highly densified integration of devices. There has been developed the smart cut method as a method for manufacturing a semiconductor substrate having an SOI (Silicon On Insulator) structure for achieving the above-mentioned film thickness reduction.

In the smart cut method, firstly a wafer for active layer, which has been processed to have an oxide film formed thereon and then ion-implanted with hydrogen at a predetermined depth thereof via the oxide film, is bonded with a supporting wafer in a room temperature, and secondly, thus obtained bonded wafer is introduced into a furnace for heat treatment, where it is heat treated at 500° C. for 30 minutes to thereby cleave and separate a part of the active layer wafer at the site of the ion-implanted area, which is followed by the step of heat treatment for bonding applied to the bonded wafer in order to enhance the bonding strength. This can produce a bonded SOI wafer comprising the supporting wafer and the active layer wafer with a buried silicon oxide film intervening therebetween. In the step of the heat treatment for bonding, a heat treatment is applied to the bonded wafer at 1100° C. in an atmospheric gas of oxygen or nitrogen for two hours.

It is to be noticeable concerning this method that a small quantity of metal impurities tends to be introduced and mixed in the active layer wafer and the active layer in the process using the high temperature, such as the steps of hydrogen ion implantation and the step of heat treatment for bonding. The metal impurities, such as Fe, Cu, among others can permeate through the buried silicon oxide film during the heat treatment after the bonding step and further diffused into the supporting wafer. In this regard, there is known one method referred to as the IG (Intrinsic Gettering) method, for example, as disclosed in the Patent Document 1, which takes advantage of the above-discussed phenomenon to capture a part of the metal impurities in the supporting wafer.

Further, in recent years, the film thickness has been reduced as thin as less than 0.10 μm (e.g., 0.02 μm to 0.05 μm) for the active layer and 0.15 μm for the buried silicon oxide film. Owing to this, the LPD (Light Point Defect) evaluation for measuring a surface defect (such as COP) of the active layer with a particle counter has a fear that a micro void could be detected as a pseudo defect. The term, micro void, refers to a minute gap present between the silicon oxide film and the supporting wafer (such as the COP emerging in a bonding interface of the supporting wafer). Such a detection of the micro void as the pseudo defect is due to the fact that a laser light used for the measurement can pass through the active layer of thin film and the buried silicon oxide film. As a result, the reliability of the LPD evaluation has been made low.

To solve the problem of such pseudo defect, it is contemplated by way of example to use a silicon wafer with no presence of COP as disclosed in the Patent Document 2.

[Patent Document 1]
Japanese Patent Laid-open Publication No. Hei9-326396
[Patent Document 2]
Japanese Patent Laid-open Publication No. Hei 2-267195

SUMMARY OF THE INVENTION

Problem to be Solved by the Invention

The invention as disclosed in the above-cited Patent Document 1 has employed a silicon wafer of n-type having a specific resistance of 10 Ωcm and an oxide concentration of the order of $1 \times 10^{18}$ atoms/cm$^3$ for the supporting wafer. The prepared wafer is annealed to form an oxide deposition, and the oxide deposition is then used to capture the metal impurities including Fe, Cu, which have permeated through the buried silicon oxide film, in the region of supporting wafer. Resultantly, this can reduce the level of contamination from the metal impurities in the active layer. The gettering effect as high as that from the deposition can be obtained alternatively by forming a polycrystal silicon on a back surface of the supporting wafer and/or by doping of phosphorus (P) of high concentration by the thermal diffusion immediately below the oxide film.

However, the heat treatment for bonding involves the heat treatment as high as 1100° C. This inversely stimulates the occurrence of slip in the surface defined in the supporting side of the supporting wafer. In order to improve this situation, the prior art has employed a method in which the bonded wafer is carried by a wafer retaining jig such as an annular suscepter made of ceramics or a wafer boat having an annular wafer retaining portion. However, there has been a problem from the viewpoint of cost that the wafer retaining jig is expensive.

In the invention as disclosed in the above-cited Patent Document 2, a monocrystal ingot of silicon is grown by using a rate of 0.8 mm/min or lower for the pulling up in the CZ method. In this case, the growth under the optimized conditions for the silicon pulling up rate and the thermal environment in the pulling up allows the interstitial silicon that will be taken in the pulling interface and the vacancy to destroy each other. Owing to this, the COP, which will be formed from the vacancy being condensed, is no more present and thus the monocrystal ingot of silicon free from the COP can be obtained. If the silicon wafer with no presence of COP is used for the supporting wafer, the micro void would be no more generated.

However, the pulling up of a wafer at a lower rate requires a long time for the pulling up as compared to the pulling up of a wafer at such a high rate as 1.0 mm/min or higher and produces a lower yield. Consequently, there has been a fear that the manufacturing cost of the bonded SOI wafer will be increased incredibly high.

An object of the present invention is to provide an SOI wafer and its manufacturing method which can manufacture such a bonded wafer inexpensively by using the smart cut method, in which a level of contamination resultant from metal impurities contained in an active layer can be reduced, the occurrence of slip of the supporting wafer is suppressed and the reliability of the LPD evaluation of the active layer of thin film can be increased.

Another object of the present invention is to provide an SOI wafer and its manufacturing method, in which an autodoping of boron from the back surface of the supporting wafer can be controlled during the step of manufacturing a substrate.

Means to Solve the Problem

A first invention provides a manufacturing method of an SOI wafer, comprising the steps of:

bonding a wafer for active layer with a supporting wafer via an insulating film interposed therebetween to thereby form a bonded wafer; and then reducing a film thickness in a part of the active layer wafer of the bonded wafer to thereby form an SOI layer for manufacturing the SOI wafer, wherein the supporting wafer contains boron by an amount of $9\times10^{18}$ atoms/cm$^3$ or more.

According to the first invention, the metal impurities, such as Fe, Cu that can diffuse and permeate through the buried insulating film among the metal impurities contained in the active layer wafer or the active layer can be captured by the boron in the supporting wafer via the buried insulating film. Further the Fe, Cu present in the supporting wafer that is movable through the buried insulating film into the active layer wafer or the active layer can be similarly captured by the boron. It is a matter of course that other metal impurities in the supporting wafer are also captured by the boron. As a result, the level of contamination due to the metal impurities in the active layer can be reduced.

Further, the boron as the impurities is present at a high concentration in the crystal of ingot. This can enhance the strength of the supporting wafer and prevent the supporting wafer from slipping during the heat treatment. The effect of preventing the occurrence of the slip of the supporting wafer is emphasized in the bonded wafer having the diameter of 300 mm or larger.

Besides, during pulling up of the ingot (e.g., the monocrystal ingot of silicon) for the supporting wafer, the crystal contains the boron by an amount of $9\times10^{18}$ atoms/cm$^3$ or more. The addition of boron, if reaching to the above-mentioned level, facilitates the OSF (Oxidation Induced Stacking Fault) ring within the crystal to contract, without requiring that the rate of pulling up is set to be a rate as low as 0.5 mm/min, for example. The atomic radius of the boron is smaller than that of the silicon. When the atom having the atomic radius smaller than that of the silicon is introduced as the impurities, a tensile stress is generated around the impurities, but the presence of interstitial silicon can mitigate the tensile stress and thus reduce the energy in the entire system. Specifically, if the boron atom having the small atomic radius is introduced, an equilibrium concentration of the interstitial silicon is increased, consequently leading to the emergence of the enlarged area including an excessive amount of interstitial silicon or the contract of the OSF ring. Generally, the inner side with respect to the OSF ring defines an area having an excessive number of vacancies, where the above-mentioned micro void or the COP exists. On the other hand, the outer side with respect to the OSF ring defines an area having an excessive amount of interstitial silicon, where the COP is not present. Accordingly, it means that the COP is no more existing in the monocrystal ingot of silicon with the OSF ring having contracted completely, and if such monocrystal ingot is applied for the SOI substrate, the pseudo defect resultant from the COP can be avoided.

Further, the supporting wafer that has been produced by slicing the ingot containing the boron by an amount of $9\times10^{18}$ atoms/cm$^3$ includes no COP crystal defect owing to the contraction of the OSF ring as discussed above. Therefore, for example, even if the active layer and the buried silicon oxide film are processed to have their film thickness reduced to such a level that a laser light for the LPD evaluation can pass through the layer and the film, respectively, the LPD evaluation never detects the micro void existing between the buried insulating film and the supporting wafer as the pseudo defect. Consequently, the reliability of the LPD evaluation of the active layer can be enhanced.

More advantageously, the bonded wafer according to the present invention can be obtained simply by adding the boron by an amount of $9\times10^{18}$ atoms/cm$^3$ or higher into the crystal during the pulling up of the ingot for the supporting wafer, as discussed above. Using the supporting wafer that has been produced by slicing the ingot of high pulling rate allows the SOI wafer to be manufactured at a low cost.

The manufacturing method of the SOI wafer according to the present invention includes a bonding method, in which the active layer wafer is bonded with the supporting wafer via the insulating film interposed therebetween to form the bonded wafer, and then the film thickness is reduced in a part of the active layer wafer of the bonded wafer thus to form the SOI layer. One of such methods includes a method in which a part of the active layer wafer of the above-discussed bonded wafer is ground and polished to thereby reduce the film thickness for manufacturing the SOI wafer.

The bonding method further includes the smart cut method, in which firstly hydrogen gas or a noble gas element is ion-implanted into the active layer wafer so as to form the ion-implanted layer in the active layer wafer, secondly said active layer wafer and said supporting wafer are bonded together to form the bonded wafer, and then the bonded wafer is subjected to the heat treatment as it is held at a predetermined temperature so that a part of the active layer wafer can be cleaved and separated away at the site of the ion-implanted layer as the interface.

The type of the active layer wafer may employ, a monocrystal silicon wafer, a germanium wafer, a silicon carbide wafer and the like, for example.

The insulating film may employ an oxide film, a nitride film and the like, for example.

The thickness of the insulating film may be, for example, no thicker than 0.2 μm, preferably in a range of 0.1 μm to 0.2 μm.

The thickness of the active layer may not be limited. For example, the film thickness in a range of 1 μm to 50 μm may be employed for the active layer of thick film. The film thickness in a range of 0.01 μm to 1 μm may be employed for the active layer of thin film.

The boron concentration of no greater than $9\times10^{18}$ atoms/cm$^3$ (the specific resistance ρ>10 mΩcm) in the supporting wafer can adversely reduce the effect of suppressing the occurrence of the slip. Particularly to those SOI wafers having the diameter of 300 mm, the occurrence of the slip would not be prevented in the bonding process at the temperature of 1100° C. or higher, unless an expensive ring retaining boat is used. A preferred boron concentration for the supporting wafer is $1\times10^{19}$ atoms/cm$^3$ or higher (ρ≦5 mΩcm).

A second invention provides a manufacturing method of an SOI wafer as defined in the first invention, further comprising the steps of:

ion-implanting of hydrogen gas or a noble gas element to said active layer wafer to thereby form an ion-implanted layer in said active layer wafer;

subsequently bonding the active layer wafer and the supporting wafer together to thereby form a bonded wafer; and then heat treating the bonded wafer to thereby induce a cleavage in the bonded wafer at the site of the ion-implanted layer as an interface.

The element to be ion-implanted may include, for example, helium (He), neon (Ne), argon (Ar), krypton (Kr), xenon (Xe) and radon (Rn), which are the noble gas element, in addition to the hydrogen (H). Those elements may be provided in a single element or as a component of the chemical compound.

The dose of the hydrogen gas or the noble gas element for the ion implantation is not limited. For example, the dose may be $2\times10^{16}$ atoms/cm$^2$.

The acceleration voltage used in the ion implantation of the hydrogen gas or the noble gas element may be not higher than 50 keV, preferably not higher than 30 keV and more preferably not higher than 20 keV. In the ion implantation of such a light element, the light element can be more precisely controlled so that the light element can be concentrated in a depth of target by using the lower acceleration voltage.

The heating temperature of the bonded wafer used for the cleavage is 400° C. or higher, preferably in a range of 400° C. to 700° C. and more preferably in a range of 450° C. to 550° C. It is difficult with the temperature lower than 400° C. to form the bubbles of light element from the light element that has been ion-implanted into the active layer wafer. Inversely, with the temperature higher than 700° C., the oxide deposition will be formed within the active layer and it may deteriorate the properties of devices.

The atmosphere within the furnace during the cleavage may be the atmosphere of non-oxidizing gas (e.g., an inactive gas such as nitrogen, argon). Alternatively, the process may be carried out in vacuum condition.

The heating time of the bonded wafer for the cleavage may be one minute or longer, preferably in a range of 10 minutes to 60 minutes. It is difficult with the heating time shorter than one minute for the light element that has been ion-implanted into the bonded wafer to form bubbles.

After the cleavage and separation process, the heat treatment for bonding intended to enhance the strength obtained from the heat treatment for bonding of the active layer wafer with the supporting wafer may be provided. The heat treatment in this process may be carried out at a heating temperature of 1100° C. for two hours, for example. The atmospheric gas in the furnace for thermal oxidation may employ the oxygen gas and the like.

The supporting wafer contains a large amount of boron. Owing to this, it is believed that the boron contamination could be induced from the diffusion of the boron into the active layer wafer or the active layer during the heat treatment after the bonding step. However, the insulating film comprising the silicon oxide (the buried insulating film), for example, have a higher level of solid solubility in comparison to the silicon. Owing to this fact, the boron in the supporting wafer is captured by the insulating film provided in the supporting wafer. As a result, the boron contamination, which otherwise may occur from the supporting wafer to the active layer, can be inhibited.

A third invention provides a manufacturing method of an SOI wafer as defined in the first invention, in which a thickness of the SOI layer is less than 0.10 μm.

A fourth invention provides a manufacturing method of an SOI wafer as defined in the second invention, in which a thickness of the SOI layer is less than 0.10 μm.

According to the third and the fourth inventions, even if the active layer and the buried silicon oxide film are processed to have their film thickness reduced to such a thickness of SOI layer as thin as less than 0.10 μm that allows a laser light for the LPD evaluation to pass through the layer and the film, respectively, the LPD evaluation never detects the micro void existing between the buried insulating film and the supporting wafer as the pseudo defect. Consequently, the reliability of the LPD evaluation of the active layer can be enhanced.

A fifth invention provides a manufacturing method of an SOI wafer as defined in the first invention, in which an insulating film is formed at least on a surface opposite to a bonding surface of the supporting wafer before the step of bonding.

A sixth invention provides a manufacturing method of an SOI wafer as defined in the second invention, in which an insulating film is formed at least on a surface opposite to a bonding surface of the supporting wafer before the step of bonding.

A seventh invention provides a manufacturing method of an SOI wafer as defined in the third invention, in which an insulating film is formed at least on a surface opposite to a bonding surface of the supporting wafer before the step of bonding.

An eighth invention provides a manufacturing method of an SOI wafer as defined in the fourth invention, in which an insulating film is formed at least on a surface opposite to a bonding surface of the supporting wafer before the step of bonding.

According to either one of the fifth to the eighth inventions, the boron present in the vicinity of the back surface of the supporting wafer may attempt to diffuse outward from the back surface of the wafer during the heat treatment after the bonding step as a result of its heat. It is however noticed that the insulating film has been previously formed in the back surface of the supporting wafer before the bonding, which serves as the gettering site for the boron. Owing to this, the outward diffusion of the boron from the supporting wafer can be suppressed. This can prevent the autodoping resultant from the boron attempting to intrude into the surface of the active layer wafer or into the surface of the active layer.

The insulating film provided on the surface of the supporting wafer in opposite to the bonding surface thereof may be an oxide film or a nitride film.

The insulating film may employ a silicon oxide film for the supporting wafer comprising a silicon wafer.

The insulating film may be formed exclusively on the back surface of the supporting wafer. Alternatively, the insulating film may be formed on both of the top and the back surfaces of the supporting wafer.

The timing of formation of the insulating film is not limited but may be any time before the bonding of the active layer wafer with the supporting wafer.

The thickness of the insulating film may be in a range of 0.1 μm to 0.5 μm, for example. The thickness less than 0.1 μm could not provide the effect of suppressing the autodoping. In contract, the thickness more than 0.5 μm requires a longer time for the film deposition and leads to a higher cost. A preferred thickness of the insulating film is in a range of 0.2μm to 0.4 μm.

For example, the oxide film provided on the back surface of the active layer wafer may be etched by the HF solution after the production of the bonded wafer. Alternatively, the bonded wafer may be shipped with the oxide film remaining thereon.

A ninth invention provides a manufacturing method of an SOI wafer as defined in either one of the first to the eighth invention, in which the supporting wafer is subjected to annealing at 1100° C. or higher in a reducing gas atmosphere containing hydrogen gas before the step of bonding.

A tenth invention provides an SOI wafer manufactured by a method comprising the steps of:

bonding a wafer for active layer with a supporting wafer via an insulating film interposed therebetween to thereby form a bonded wafer; and then reducing a film thickness in a part of the active layer wafer of the bonded wafer to thereby form an SOI layer for manufacturing the SOI wafer, wherein the supporting wafer that has been bonded contains boron by an amount of $9 \times 10^{18}$ atoms/cm$^3$ or more, and the SOI layer has a thickness of less than 0.10 μm.

According to the ninth invention, before the step of bonding, the supporting wafer is subjected to the annealing at a temperature of 1100° C. or higher in the reducing gas atmosphere containing the hydrogen gas. This can facilitate the outward diffusion of the boron present in the vicinity of the top and the back surfaces of the supporting wafer, so that the boron diffuses to disappear from the top and the back surfaces of the supporting wafer. Consequently, the autodoping of the boron in the supporting wafer to the surface of the active layer wafer or the surface of the active layer can be prevented during the heat treatment after the step of bonding.

The timing of the annealing is not limited but may be any time before the bonding of the active layer wafer with the supporting wafer.

The reducing gas, other than the hydrogen, may include carbon monoxide gas, sulfur dioxide gas and the like, for example.

The annealing temperature lower than 1100° C. leads to a lower diffusion coefficient of the boron that could not achieve the outward diffusion of the boron in the vicinity of the top and the back surfaces of the wafer. A preferred annealing temperature of the bonded wafer is in a range of 1100° C. to 1200° C.

The annealing time may be in a range of 0.1 hour to five hours, for example. A preferred annealing time for the supporting wafer is in a range of 0.1 hour to one hour.

Effect of the Invention

According to the present invention, the supporting wafer contains the boron by an amount of $9 \times 10^{18}$ atoms/cm$^3$ or more. Owing to this, the metal impurities of Fe, Cu that has diffused outward and resultantly permeated through the buried insulating film among the metal impurities contained in the active layer wafer or the active layer as well as the metal impurities contained in the supporting wafer can be captured by the boron serving as the gettering site. As a result, the level of contamination from the metal impurities in the active layer can be reduced.

Further, since the boron is present in the crystal of ingot at a high concentration, the strength of the supporting wafer can be increased and thus the occurrence of the slip of the supporting wafer during the heat treatment can be prevented.

In addition, since no crystal defect exists in the supporting wafer, even if the film thickness is reduced in the active layer and the silicon oxide film, the LPD evaluation would not detect any micro voids present between the buried insulating film and the supporting wafer as the pseudo defects and so the reliability of the LPD evaluation of the active layer can be improved.

More advantageously, since such a bonded wafer as described above can be obtained simply by adding the boron by an amount of $9 \times 10^{18}$ atoms/cm$^3$ or more into the crystal at the time of pulling up of the ingot to be processed into the supporting wafer, the bonded wafer having the effects as described above can be manufactured favorably at a lower cost.

Further, since the oxide film has been formed at least on the surface opposite to the bonding surface of the supporting wafer before the step of bonding, this oxide film can help inhibit the boron from diffusing outward from the back surface of the supporting wafer during the heat treatment after the step of bonding. Consequently, the autodoping resultant from the boron attempting to intrude into the surface of the active layer wafer or the surface of the active layer can be prevented.

Still further, since the supporting wafer is subjected to the annealing at the temperature of 1100° C. or higher in the reducing gas atmosphere containing the hydrogen gas before the step of bonding, the boron present in the vicinity of the top and the back surfaces of the supporting wafer can disappear with the aid of the outward diffusion thereof. As a result, the autodoping of the boron into the surface of the active layer wafer or the surface of the active layer during the heat treatment after the step of bonding can be prevented, as well.

Figure 1:
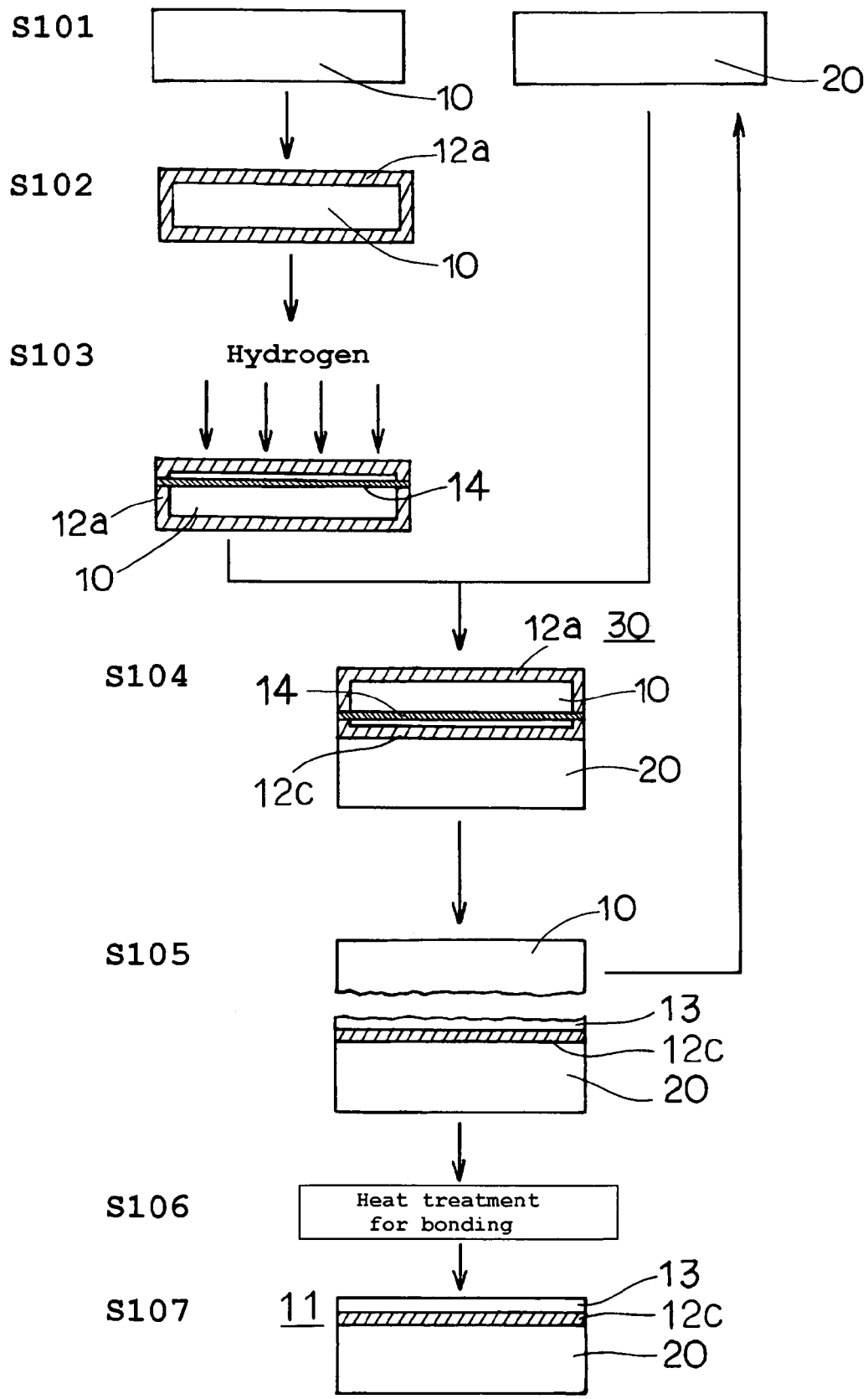
FIG. 1 is a flow sheet showing a manufacturing method of an SOI wafer according to a first embodiment of the present invention.

| Description of reference numerals | |
|---|---|
| 10 | Active layer wafer |
| 12a | Silicon oxide film (Insulating film) |
| 13 | Active layer |
| 14 | Hydrogen ion implanted area (Ion-implanted area) |
| 20 | Supporting wafer |
| 30 | Bonded wafer |

DESCRIPTION OF THE PREFERRED EMBODIMENTS

Preferred embodiments of the present invention will now be described with reference to the attached drawings.

First Embodiment

Firstly, a monocrystal ingot of silicon of p-type that has been added with boron at a low concentration by an amount of $2 \times 10^{15}$ atoms/cm$^3$ is pulled up in the CZ method, as shown in step 101 of FIG. 1. A rate of pulling up is 1.0 mm/min. After that, the monocrystal ingot of silicon undergoes a series of processing comprising block cutting, slicing, beveling and mirror polishing. Those steps of processing produce a wafer to be prepared as an active layer wafer 10 of p-type and mirror-polished having a thickness of 725 μm, a diameter of 200 mm, a face orientation of (100) face, a specific resistance of 10 Ωcm.

On the other hand, a monocrystal ingot of silicon of p-type that has been added with the boron at a high concentration by an amount of $1 \times 10^{19}$ atoms/cm$^3$ is pulled up in the Cz method. After that, the monocrystal ingot of silicon undergoes a series of processing comprising block cutting, slicing, beveling and mirror polishing. Those steps of processing produce a wafer to be prepared as a supporting wafer 20 of p-type and mirror-polished having a thickness of 725 μm, a diameter of 200 mm, a face orientation of (100) face, a specific resistance of 8 Ωcm.

Following that step, the active layer wafer 10 is introduced into a thermal oxidation device, where the thermal oxidation is applied to the active layer wafer 10 in an oxygen gas atmosphere, as shown in step S102 of FIG. 1. This forms a silicon oxide film 12a having a thickness of about 0.15 μm entirely across the exposed surface of the active layer wafer 10. The condition of thermal treatment may be defined by the thermal treatment at 1000° C. for seven hours.

Subsequently, an intermediate current ion implanting device is used to perform the ion implantation of the hydrogen with an acceleration voltage of 50 keV into the active layer wafer 10 at a predetermined depth measured from the mirror finished surface thereof. Thus the hydrogen ion implanted area 14 is formed in the active layer wafer 10. The dose used in this step is $5 \times 10^{16}$ atoms/cm$^2$.

Subsequently, the active layer wafer 10 and the supporting wafer 20 are bonded together by using the surface of the active layer wafer 10 and the mirror-polished surface of the supporting wafer as the bonding surfaces (the superposed surfaces) via the silicon oxide film 12a interposed therebetween with a known jig in a vacuum unit, for example, thus to produce the bonded wafer 30, as shown in step S104 of FIG. 1. In this step, the active layer wafer 10 and the supporting wafer 20 are connected together via the silicon oxide film 12a interposed therebetween, which silicon oxide film 12a at the junction between the active layer wafer 10 and the supporting wafer 20 defines a buried silicon oxide film (insulating film) 12c. Further, in the step of bonding, the bonding may be performed after a treatment with oxygen plasma (a treatment to activate the surface with the oxygen plasma) in order to improve the bonding strength and to reduce a defect from the bonding, such as a void.

Then, the bonded wafer 30 is introduced into a thermal treatment device for cleavage, though not shown, and heat treated in an atmosphere of nitrogen gas at a furnace temperature of 500° C., as shown in step S105 of FIG. 1. The duration of heat treatment is 30 minutes. As a result of this thermal treatment, a part of the active layer wafer 10 is cleaved and separated from the bonded wafer 30 at the site of the hydrogen ion implanted area 14 while leaving the active layer 13 on the bonding interface of the supporting wafer 20. It is also possible to reuse the part of the active layer wafer 10, which has been cleaved off from the bonded wafer 30, as the silicon wafer serving as the supporting wafer 20 for the subsequent manufacturing process.

After the cleavage, the heat treatment for bonding is applied to the bonded wafer 30 in a nitrogen gas atmosphere at 1150° C. for two hours, as shown in step S106 of FIG. 1. This treatment can enhance the bonding strength between the active layer wafer 10 and the supporting wafer 20.

Following the above step, polishing is applied to the surface of the active layer wafer 13 by using a polishing device, while at the same time a process of what is called "a sacrificial oxidation" is applied to the surface of the active layer 13. In the sacrificial oxidation, firstly the bonded wafer 30 is introduced into the furnace for the thermal oxidation, where the bonded wafer 30 is heat treated in the atmosphere of oxidizing gas at 1000° C. for seven hours. This can produce a 0.15 μm thick silicon oxide film, though not shown, over the surface of the active layer 13 including the area damaged upon hydrogen ion implantation. After that, the surface of the active layer 13 is brought into contact with the HF cleaning solution to allow the silicon oxide film to dissolve away in the dipping method. In this step, the top layer portion of the active layer 13 that has been roughened during the cleavage and separation can be removed along with the silicon oxide film.

Thus, the bonded SOI wafer 11 has been produced in the smart cut method, as shown in step S107 of FIG. 1.

As discussed above, during pulling up of the monocrystal ingot of silicon for the supporting wafer 20, the crystal contains the boron at a concentration as high as $1\times10^{19}$ atoms/cm$^3$. Owing to this, even if the pulling up is carried out at a high rate of 1.0 mm/min rather than using a lower rate of 0.5 mm/min or lower, the OSF ring within the crystal can be contracted, as well. Consequently, such an ingot that includes no crystal defect and thus such a supporting wafer 20 that contains no crystal defect can be obtained.

This can facilitate the production of the supporting wafer 20 at a high throughput as well as high yield. Further advantageously, such a wafer can be produced in accordance with the smart cut method known in the art, excluding the point of increasing the concentration of the boron in the monocrystal ingot of silicon prepared for the supporting wafer 20 in the first embodiment. As a result, the bonded SOI wafer 11 having the above described effects can be manufactured at a low cost.

During the heat treatment after the step of bonding, the metal impurities contained in the supporting wafer 20 in addition to the metal impurities of Fe, Cu, which can permeate through the buried insulating film by the diffusion, among the metal impurities contained in the active layer wafer 10 or the active layer 13 can be captured by the boron. As described above, since a large amount of boron exists in the supporting wafer 20, which can serve as the gettering site, the metal impurities contained in the supporting wafer 20 in addition to a part of the metal impurities contained in the active layer wafer 10 and/or the active layer 13 can be captured satisfactorily. As a result, the level of contamination from the metal impurities in the active layer 13 can be reduced.

Further, the boron, or the impurities, is present in the supporting wafer 20 at such a high concentration as discussed above. This can enhance the strength of the supporting wafer 20 and prevent the occurrence of slip of the supporting wafer 20 during the heat treatment.

Figure 3:
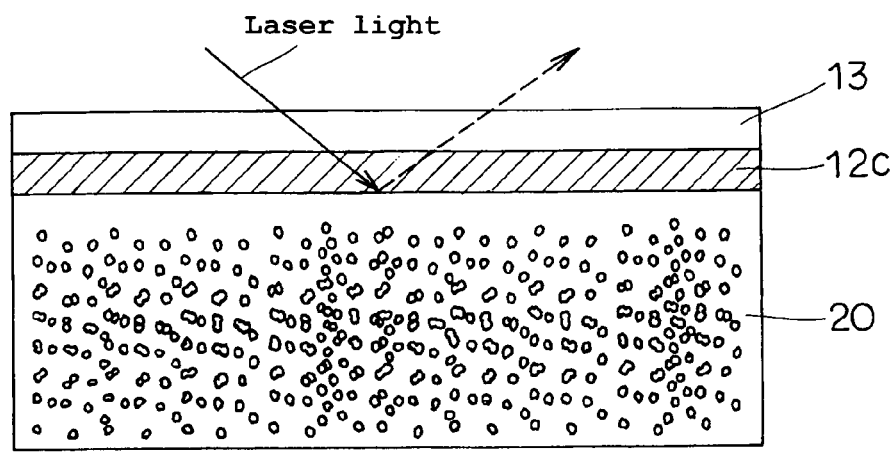
FIG. 3 is an enlarged sectional view of a main part showing a state of the LPD evaluation test in a bonded wafer obtained by a manufacturing method of an SOI wafer according to the first embodiment of the present invention.
Figure 4:
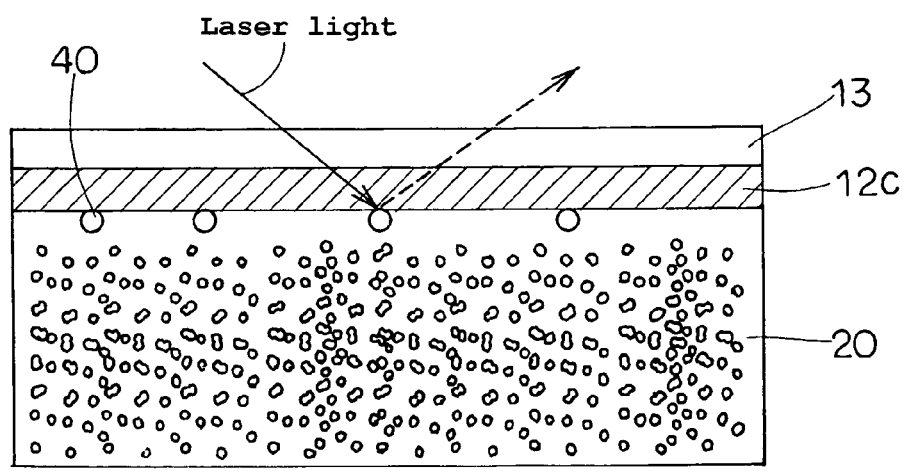
FIG. 4 is an enlarged sectional view of a main part showing a state of the LPD evaluation test in a bonded wafer obtained by a manufacturing method of an SOI wafer according to the prior art means.

In addition, no crystal defect exists in the supporting wafer 20 that contains the boron at as high concentration as $9\times10^{18}$ atoms/cm$^3$. Therefore, byway of example as shown in FIG. 3, even if the film thickness is reduced in the active layer 13 and the buried silicon oxide film 12c to such a level that the laser light for the LPD evaluation can pass through respective layers, no void would be developed between the buried silicon oxide film 12c and the supporting wafer 20 as has been observed typically in the prior art. Consequently, the detection of any micro voids 40 as the pseudo defects in the LPD evaluation, as shown in FIG. 4, would no more occur. As a result, the reliability of the LPD evaluation of the active layer 13 can be improved.

Figure 2:
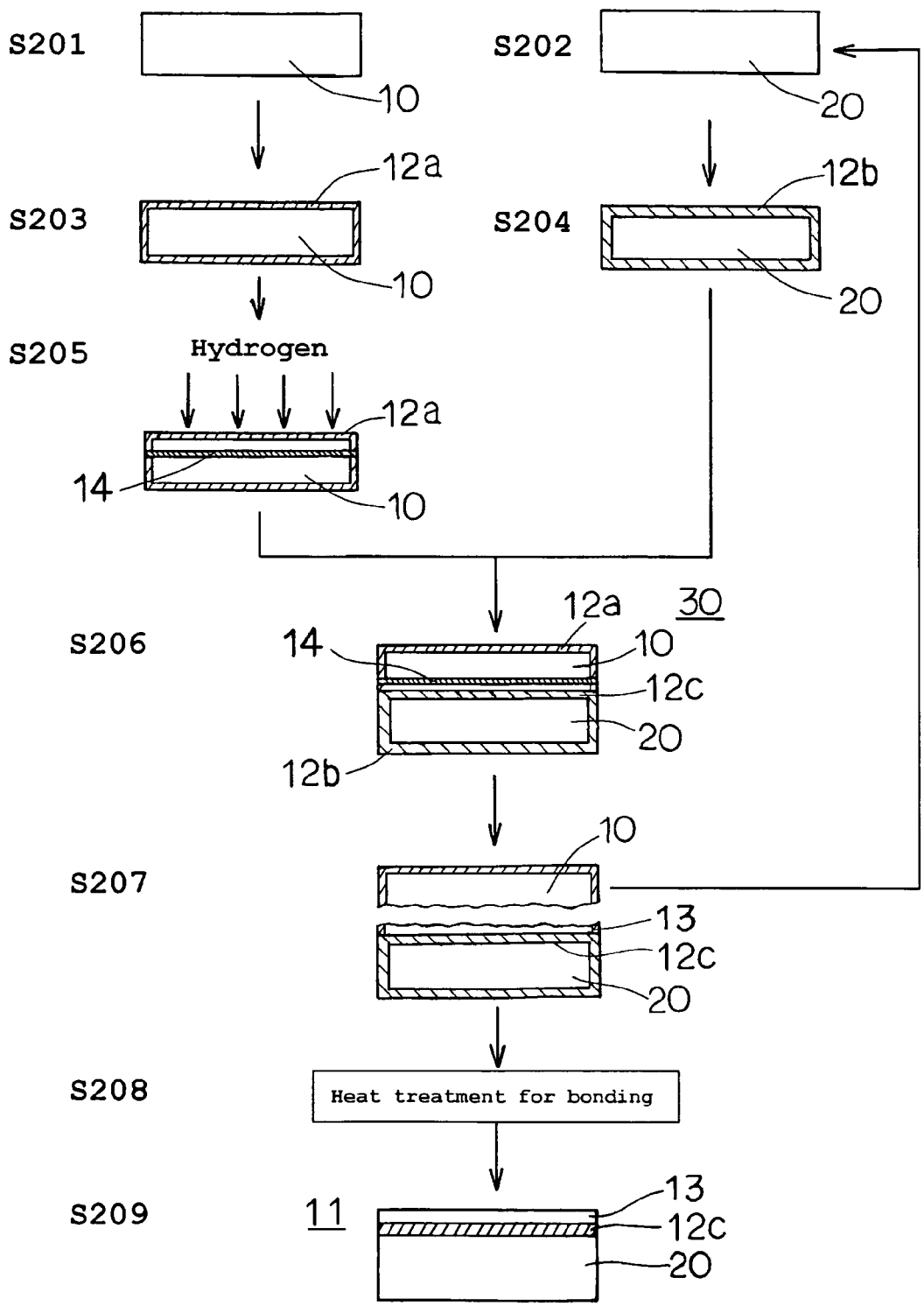
FIG. 2 is a flow sheet showing another manufacturing method of an SOI wafer according to the first embodiment of the present invention.

Further, as shown in step S204 of FIG. 2, the oxide film 12b may be formed on the supporting wafer 20 by using a CVD unit, for example, before the step of bonding, so that the boron in the supporting wafer 20 can be inhibited from causing the autodoping over the surface of the active layer wafer 20 or the surface of the active layer 13 during the heat treatment subsequent to the step of the heat treatment for bonding.

Specifically, during the heat treatment following the step of bonding, the heat stimulates the boron to diffuse outward from the back surface of the supporting wafer 20. However, the silicon oxide film 12b has been previously formed on the back surface of the supporting wafer 20, which can serve as the gettering site for the boron. This can inhibit the outward diffusion of the boron from the back surface of the supporting wafer 20. As a result, the autodoping resultant from the boron attempting to intrude into the surface of the active layer wafer 10 or the surface of the active layer 13 can be prevented.

It is to be noted that the flow sheet for the manufacturing process of the SOI wafer shown in FIG. 2 represents that for manufacturing the SOI wafer as defined in FIG. 1 that has been further added with the step S204.

Further, other means for preventing the autodoping may employ the annealing process, for example, where the supporting wafer 20 is subjected to the annealing at 1100° C. or higher in the hydrogen gas atmosphere before the bonding as shown in step S104 of FIG. 1. It is to be noted that instead of the hydrogen gas, other reducing gas atmosphere may be used. This can facilitate the outward diffusion of the boron in the vicinity of the top and the back surfaces of the supporting wafer 20, so that the boron contained in the supporting wafer 20 can diffuse outward to disappear from both of the top and the back surfaces of the wafer. As a result, the autodoping during the heat treatment after the bonding can be prevented.

A report on a result obtained from a comparison and examination with respect to the bonded SOI wafers produced in accordance with the present invention method and the prior art method, respectively, will be herein presented specifically on the occurrence of slip in a back surface of a supporting wafer as well as the distribution of the LPD in an active layer surface in a bonded SOI wafer.

The X-ray topography (XRT) method was employed for an evaluation method of the slip. Further, to evaluate the distribution of the LPD, a defect evaluation by using a laser device was employed. Table 1 shows the result. It is to be noticed that the occurrence of the slip in the table is indicated by using ○ for the length of slip no longer than 20 mm and X for the length of slip of 20 mm or longer that are observed.

TABLE 1

|  | Boron concentration in supporting wafer | Presence of LPD | Occurrence of slip | Distribution of LPD in surface of SOI layer |
|---|---|---|---|---|
| Comparative example 1 | $2 \times 10^{15}/cm^3$ (15 Ωcm) | Present | X | More in the center of wafer. Consistent with COP distribution in the supporting wafer. |
| Comparative example 2 | $4 \times 10^{18}/cm^3$ (15 mΩcm) | Present in center of wafer | X | More in the center of wafer. Consistent with COP distribution in the supporting wafer. |
| Test example 1 | $9 \times 10^{18}/cm^3$ (10 mΩcm) | Nil | ○ | No particular distribution observed |
| Test example 2 | $1 \times 10^{19}/cm^3$ (5 mΩcm) | Nil | ○ | No particular distribution observed |

As apparent from Table 1, for both of the test example 1 (the boron concentration: $9 \times 10^{18}/cm^3$) and the test example 2 (the boron concentration: $2 \times 10^{15}/cm^3$) according to the present invention, no slip as long as 20 mm or longer occurred in the back surface of the supporting wafer and more favorably no particular distribution of LPD within the active layer surface were observed. It is clear that the improvement has been achieved over the comparative example 1 (the boron concentration: $2 \times 10^{15}/cm^3$) and the comparative example 2 (the boron concentration: $4 \times 10^{15}/cm^3$) according to the art.

What is claimed is:

1. A manufacturing method of an SOI wafer, comprising:
preparing a supporting wafer comprising boron in an amount of $9 \times 10^{18}$ atoms/$cm^3$ or more;
forming an insulating film having a thickness of 0.1-0.5 μm on at least a surface opposite to a bonding surface of said supporting wafer;
ion-implanting hydrogen gas or a noble gas element to an active layer wafer to thereby form an ion-implanted layer in said active layer wafer;
bonding said active layer wafer with the other surface of said supporting wafer via an insulating film interposed therebetween to thereby form a bonded wafer; and then
heat treating said bonded wafer to thereby induce cleavage in a portion of said bonded wafer at the site of the ion-implanted layer as an interface to thereby form an SOI layer with said remaining active layer wafer for manufacturing said SOI wafer,
wherein a thickness of the SOI layer is less than 0.10 μm.

* * * * *